United States Patent
Bal et al.

(10) Patent No.: US 12,055,989 B2
(45) Date of Patent: Aug. 6, 2024

(54) CLOCK DELAY CIRCUIT FOR CHIP RESET ARCHITECTURE

(71) Applicant: STMICROELECTRONICS INTERNATIONAL N.V., Geneva (CH)

(72) Inventors: Ankur Bal, Greater Noida (IN); Vikas Chelani, Noida (IN)

(73) Assignee: STMICROELECTRONICS INTERNATIONAL N.V., Geneva (CH)

( * ) Notice: Subject to any disclaimer, the term of this patent is extended or adjusted under 35 U.S.C. 154(b) by 0 days.

(21) Appl. No.: 17/194,037

(22) Filed: Mar. 5, 2021

(65) Prior Publication Data

US 2021/0286417 A1   Sep. 16, 2021

Related U.S. Application Data

(60) Provisional application No. 62/987,801, filed on Mar. 10, 2020.

(51) Int. Cl.
*G06F 1/24* (2006.01)
*G06F 1/12* (2006.01)

(52) U.S. Cl.
CPC . *G06F 1/24* (2013.01); *G06F 1/12* (2013.01)

(58) Field of Classification Search
CPC .... G06F 1/10; G06F 1/12; G06F 1/24; H03K 17/22
See application file for complete search history.

(56) References Cited

U.S. PATENT DOCUMENTS

| | | | |
|---|---|---|---|
| 5,708,381 A | 1/1998 | Higashisaka | |
| 6,188,256 B1 * | 2/2001 | Birns et al. | 327/142 |
| 7,075,336 B2 | 7/2006 | Kojima et al. | |
| 7,383,523 B2 | 6/2008 | Inoue | |
| 7,444,606 B2 | 10/2008 | Kosugi et al. | |
| 7,594,211 B1 | 9/2009 | Tian et al. | |
| 7,711,940 B2 | 5/2010 | Wada | |
| 8,885,438 B1 * | 11/2014 | Ryan | G11C 7/22 |
| 9,356,769 B2 | 5/2016 | Lin | |
| 10,284,185 B1 * | 5/2019 | Gaide | H03K 19/1774 |
| 2005/0253638 A1 * | 11/2005 | Dietrich | G06F 1/24 |
| | | | 327/198 |

(Continued)

FOREIGN PATENT DOCUMENTS

| | | |
|---|---|---|
| CN | 1404231 A | 3/2003 |
| CN | 1694241 A | 11/2005 |

(Continued)

*Primary Examiner* — Lincoln D Donovan
*Assistant Examiner* — James G Yeaman
(74) *Attorney, Agent, or Firm* — SEED IP LAW GROUP LLP

(57) ABSTRACT

An integrated circuit includes a plurality of flip-flops and a global reset network for resetting the flip-flops. The integrated circuit includes a synchronous clock delay circuit that delays, responsive to a global reset signal, a transition in a clock signal provided to the flip-flops. The delay in the transition of the clock signal ensures that all of the flip-flops receive the global reset signal within a same delayed clock cycle and that the flip-flops do not receive the global reset signal during a rising or falling edge of the clock signal.

19 Claims, 5 Drawing Sheets

(56) References Cited

U.S. PATENT DOCUMENTS

| | | | |
|---|---|---|---|
| 2009/0193285 A1* | 7/2009 | Lutscher | G06F 13/4059 |
| | | | 713/600 |
| 2012/0062282 A1 | 3/2012 | Hu | |
| 2020/0058345 A1* | 2/2020 | Kim | G11C 7/1057 |

FOREIGN PATENT DOCUMENTS

| | | | | |
|---|---|---|---|---|
| CN | 102361456 A | | 2/2012 | |
| CN | 102419417 A | | 4/2012 | |
| CN | 108121619 A | | 6/2018 | |
| CN | 110679087 A | | 1/2020 | |
| CN | 110827889 A | | 2/2020 | |
| JP | H07-168652 A | | 7/1995 | |
| JP | 2010277608 A | | 12/2010 | |
| KR | 20080101495 A | * | 11/2008 | G06F 1/08 |
| KR | 20080101495 A | * | 11/2008 | |

\* cited by examiner

CLOCK DELAY CIRCUIT FOR CHIP RESET ARCHITECTURE

BACKGROUND

Technical Field

The present disclosure relates to the field of integrated circuits. The present disclosure relates more particularly to reset timing distribution for digital integrated circuits.

Description of the Related Art

Integrated circuits often include a large number of flip-flops for various logic and memory circuits. In some cases it may be desirable to reset all of the flip-flops of the logic and memory circuits at once. For this purpose, integrated circuits often include global reset networks for enabling a global reset of all of the flip-flops of the logic and memory circuits. The global reset networks enable a global reset signal to reset the flip-flops. Design of the global reset network can be very problematic.

BRIEF SUMMARY

One embodiment is an integrated circuit including a plurality of first flip-flops and a reset network configured to supply a global reset signal to each of the first flip-flops. The integrated circuit includes a clock circuit configured to generate a first clock signal. The integrated circuit includes a synchronous clock delay circuit configured to receive the first clock signal and to output a second clock signal, wherein the synchronous clock delay circuit is configured to delay a transition in the second clock signal responsive to the global reset signal. The integrated circuit includes a clock network configured to receive the second clock signal from the synchronous clock delay circuit and to provide the second clock signal to the first flip-flops.

One embodiment is a method including generating a first clock signal, receiving the first clock signal at a synchronous clock delay circuit, and outputting a second clock signal from the synchronous clock delay circuit to a plurality of first flip-flops via a clock network. The method includes receiving a global reset signal at the synchronous clock delay circuit and at a reset network coupled to each of the first flip-flops and delaying a transition in the second clock signal responsive to the global reset signal. One embodiment is an integrated circuit including a global reset generator configured to generate a global reset signal, a plurality of flip-flops, and a reset network configured to provide the global reset signal to each of the flip-flops. The integrated circuit includes a clock circuit configured to generate a first clock signal and a clock delay generator configured to receive the first clock signal, to generate a second clock signal based on the first clock signal, and to delay a rising edge or a falling edge of the second clock signal responsive to the global reset signal.

DETAILED DESCRIPTION

Figure 1A:
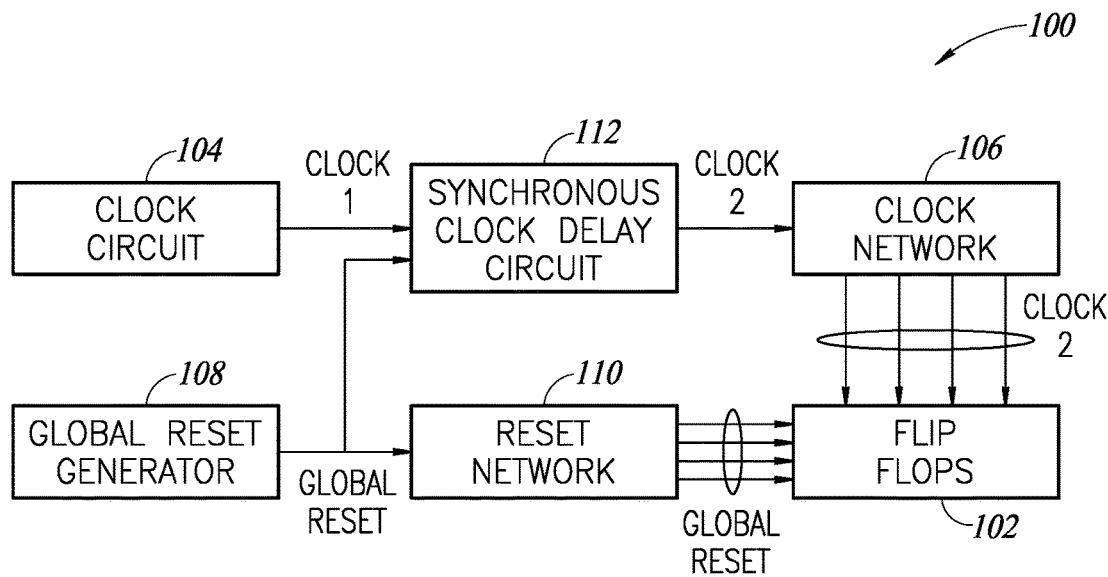
FIG. 1A is a block diagram of an integrated circuit, according to one embodiment.

FIG. 1 is a block diagram of an integrated circuit 100, according to one embodiment. The integrated circuit 100 includes a plurality of flip-flops 102, a clock circuit 104, a clock network 106, a global reset generator 108, a reset network 110, and a synchronous clock delay circuit 112. The components of the integrated circuit 100 cooperate together to manage the global reset of the flip-flops 102.

In one embodiment, the flip-flops 102 are part of various logic and memory circuits of the integrated circuit 100. The flip-flops 102 can act as storage elements for logic and memory circuits. Each flip-flop has two stable states that can be used to store information. The flip-flops can include set-reset type flip-flops, toggle type flip-flops, JK type flip-flops, data or delay type flip-flops.

In one embodiment, the each flip-flop 102 can include a reset terminal, a clock input terminal, one or more data input terminals, and one or more data output terminals. The clock input terminal is configured to receive a clock signal to control the timing of switching between states responsive to input signals. The signals present at the data output terminals indicate the current state of the flip-flop. The signals present at the data output terminals are based on the signals received at the data input terminals, the clock input terminal, and the reset terminal. The reset terminal of each flip-flop 102 can be utilized to reset a current state of the flip-flop 102. As will be described in more detail below, the integrated circuit 100 enables a global reset of all of the flip-flops 102 via the reset terminals of the flip-flops 102.

In one embodiment, the global reset generator 108 generates a global reset signal. The global reset generator 108 can generate the global reset signal responsive to a command received from a circuit, component, or device external to the integrated circuit 100. For example, a user may press the reset button on an electronic device of which the integrated circuit 100 is part. The global reset generator 108 receives a signal indicating that a global reset should be performed responsive to the press of the reset button by the user. The global reset generator 108 outputs the global reset signal. The global reset generator 108 can generate the global reset signal responsive to other types of external signals than described above.

In one environment, the global reset generator 108 can generate the global reset signal responsive to an internally generated signal of the integrated circuit 100. For example, a circuit or component of the integrated circuit 100 may determine that a global reset should be performed. The circuit or component may provide a signal to the global reset generator 108 indicating that the global reset generator 108 should initiate a global reset. The global reset generator 108 can generate the global reset signal responsive to the commander signal received from the circuit or component of the integrated circuit 100.

The global reset signal initiates a global reset of the flip-flops 102. Each flip-flop 102 receives the global reset signal on the reset terminal of the flip-flop 102. Because each of the flip-flops 102 receives the global reset signal, all of the flip-flops 102 are reset. In this way, the global reset generator 108 initiates a global reset of the flip-flops 102.

The reset network 110 provides the global reset signal to the flip-flops 102. The reset network 110 receives the global reset signal from the global reset generator 108. The reset network 110 passes the global reset signal to the reset terminals of all the flip-flops 102. Accordingly, the reset network 110 is coupled between the global reset generator 108 in the flip-flops 102.

The reset network 110 includes a network of signal paths. The network of signal paths branch from the input of the reset network that receives the global reset signal to the individual reset terminals of each of the flip-flops 102. The signal paths may include conductive tracks formed in the various metal layers (metal 1, metal 2, etc.) of the integrated circuit 100. The signal paths may also include conductive plugs that fill vias formed in the various dielectric layers between the various metal layers. The larger the number of flip-flops 102, the more extensive and complex the reset network 110. As will be described in more detail below, without some of the solutions described herein, the design of the reset network 110 can be highly problematic.

Transitions in the states of the flip-flops 102 are also managed by clock signals provided to the flip-flops 102. Typically, a transition in the state of a flip-flop 102 occurs after the rising or falling edge of the clock signal provided to the flip-flop 102. When the reset signal is received by a flip-flop 102, the reset will only occur after the next rising or falling edge of the clock signal. Likewise, a transition in the state of a flip-flop 102 based on a change in the signal received at one of the data input terminals will only occur after the next rising or falling edge of the clock signal.

The clock circuit 104 generates a first clock signal. The first clock signal alternates between a high and a low value in accordance with a characteristic frequency of the clock signal. In one embodiment, the first clock signal is substantially a square wave. In practice, the rising and falling edges of the first clock signal include a slew rate corresponding a duration of the transition of a rising or falling edge.

In one embodiment, the clock circuit 104 includes a crystal oscillator. The crystal oscillator outputs an oscillating voltage signal. The clock circuit 104 can include components that condition the oscillating voltage signal output by the crystal oscillator. For example, the oscillating voltage output by the crystal oscillator may be substantially sinusoidal. The clock circuit 104 can include components that condition the oscillating voltage into the form of a square wave. Furthermore, the clock circuit 104 can include frequency dividers or frequency multipliers configured to convert a natural frequency of the crystal oscillator to a selected clock frequency. In one embodiment, the crystal oscillator may be external to the integrated circuit 100. Accordingly, the clock circuit 104 may receive a signal from the crystal oscillator and the output the first clock signal based on the signal received from the crystal oscillator.

In one embodiment, the clock circuit 104 can include a voltage controlled oscillator, a current controlled oscillator, a ring oscillator, or other types of oscillators that can generate oscillating signals. The oscillating signals can be conditioned form the first clock signal. Those of skill in the art will recognize, and in light of the present disclosure, that many types of clock circuits can be utilized to generate the first clock signal for the integrated circuit 100, without departing from the scope of the present disclosure.

The synchronous clock delay circuit 112 receives the first clock signal from the clock circuit 104. This synchronous clock delay circuit 112 generates a second clock signal based on the first clock signal. The synchronous clock delay circuit 112 generates the second clock signal for controlling the timing of the flip-flops 102. As will be described in more detail below, the synchronous clock delay circuit 112 controls the clock signal provided to the flip-flops 102 to facilitate simple and reliable global reset procedures for the flip-flops 102.

The clock network 106 provides the second clock signal to the flip-flops 102. The clock network 106 receives the second clock signal from the synchronous clock delay circuit 112. The clock network 106 passes the second clock signal to the clock terminals of all the flip-flops 102. Accordingly, the clock network 106 is coupled between the synchronous clock delay circuit 112 and the flip-flops 102.

The clock network 106 includes a network of signal paths. The network of signal paths branch from the input of the reset network that receives the second clock signal to the individual clock terminals of each of the flip-flops 102. The signal paths may include conductive tracks formed in the various metal layers (metal 1, metal 2, etc.) of the integrated circuit 100. The signal paths may also include conductive plugs that fill vias formed in the various dielectric layers between the various metal layers.

If the timing between the second clock signal and the global reset signal received by one of the flip-flops 102 is not properly managed, the flip-flop 102 may not be properly reset during a global reset. In particular, if the flip-flop 102 receives the global reset signal during a transition (i.e., a rising edge or falling edge) of the second clock signal, then the flip-flop 102 may not be reset. This can be highly problematic and can cause serious problems in the operation of the integrated circuit 100.

For high-speed integrated circuits, timing the reception of the global reset signal by the flip-flops to avoid possible transitions is very difficult. The clock signals of high speed integrated circuits may have frequencies in the range of several gigahertz. The higher the frequency of the clock signal, the smaller the duration of time between rising and falling edges of the clock signal. Thus, the window for receiving the global reset signal may be very small for high-frequency clock signals.

One solution to ensure that the flip-flops receive the global reset signal between transitions in the clock signal is to design the reset network 110 with a high degree of precision with regards to signal propagation times to each of the flip-flops 102. For example, the reset network 110 may include signal paths with very carefully selected lengths so that the global reset signal arrives at the flip-flops 102 to within a selected window of time. This can include a large number of buffers or other delay elements inserted into the signal paths. The buffers or other delay elements are designed to introduce selected amounts of signal propagation delay into various of the signal paths in the reset network 110. Despite the potential effectiveness, this solution has several drawbacks. For example, reset networks 110 are often designed near the end of an integrated circuit design process. Accordingly, many aspects of the various layouts for the integrated circuit layers may need to be redesigned to accommodate the various precisely calculated signal path lengths and to accommodate transistors that make up the buffers used as delay elements. This can result in massive design headaches and may even result in the redesign of large portions of the integrated circuit layouts all to accommodate the global reset network.

Embodiments of the present disclosure advantageously utilize the synchronous clock delay circuit 112 to alleviate the aforementioned problems in reset networks. In particular, the synchronous clock delay circuit 112 is configured to delay a transition in the second clock signal responsive to the global reset signal. When the global reset signal is generated, the synchronous clock delay circuit 112 receives the global, or a signal derived from the global reset signal. The synchronous clock delay circuit 112 then delays a transition in the second clock signal for a selected duration. The length of the delay is selected to ensure that the global reset signal arrives at all the flip-flops 102 before the next transition in the second clock signal.

Accordingly, rather than very carefully designing the signal path lengths in the reset network 110 for each of the flip-flops 102, the synchronous clock delay circuit 112 simply delays a transition in the second clock signal. The delay in the transition can be easily selected to ensure that the global reset signal has arrived at all of the flip-flops 102 before the next transition in the second clock signal. This eliminates a large number of delay elements (i.e., transistor based buffers) and reduces the design constraints on the signal paths of the reset network 110. The layouts of the signal paths can be designed late in the design process without impacting previously designed circuit components. This is because the signal paths can easily be placed in any areas where sufficient area remains to accommodate signal lines. Because the time constraints for the signal propagation of the global reset signal are comparatively relaxed, the signal paths can be laid out in a relatively unbalanced manner. Thus, the synchronous clock delay circuit 112 conserves semiconductor area and reduces layout constraints while improving the reliability of global reset processes.

In one embodiment, the synchronous clock delay circuit 112 can delay the transition in the second clock signal for a selected number of cycles of the first clock signal. The second clock signal is generated based on the first clock signal. The synchronous clock delay circuit 112 is arranged to selectively delay a transition (i.e., a rising or falling edge) in the second clock signal for a selected number of cycles of the first clock signal. The number of cycles of the first clock signal for the delay can be selected based on a maximum expected propagation time for the global reset signal to reach all of the flip-flops 102. If the expected propagation time the global reset signal to reach all of the flip-flops 102 is two cycles of the first clock signal, then the synchronous clock delay circuit 112 can be designed to selectively delay a transition in the second clock signal for 3 or more cycles of the first clock signal. Those of skill in the art will recognize, in light of the present disclosure, that many delay values and delay schemes can be utilized for delaying the tradition in the second clock signal without departing from the scope of the present disclosure.

Figure 1B:
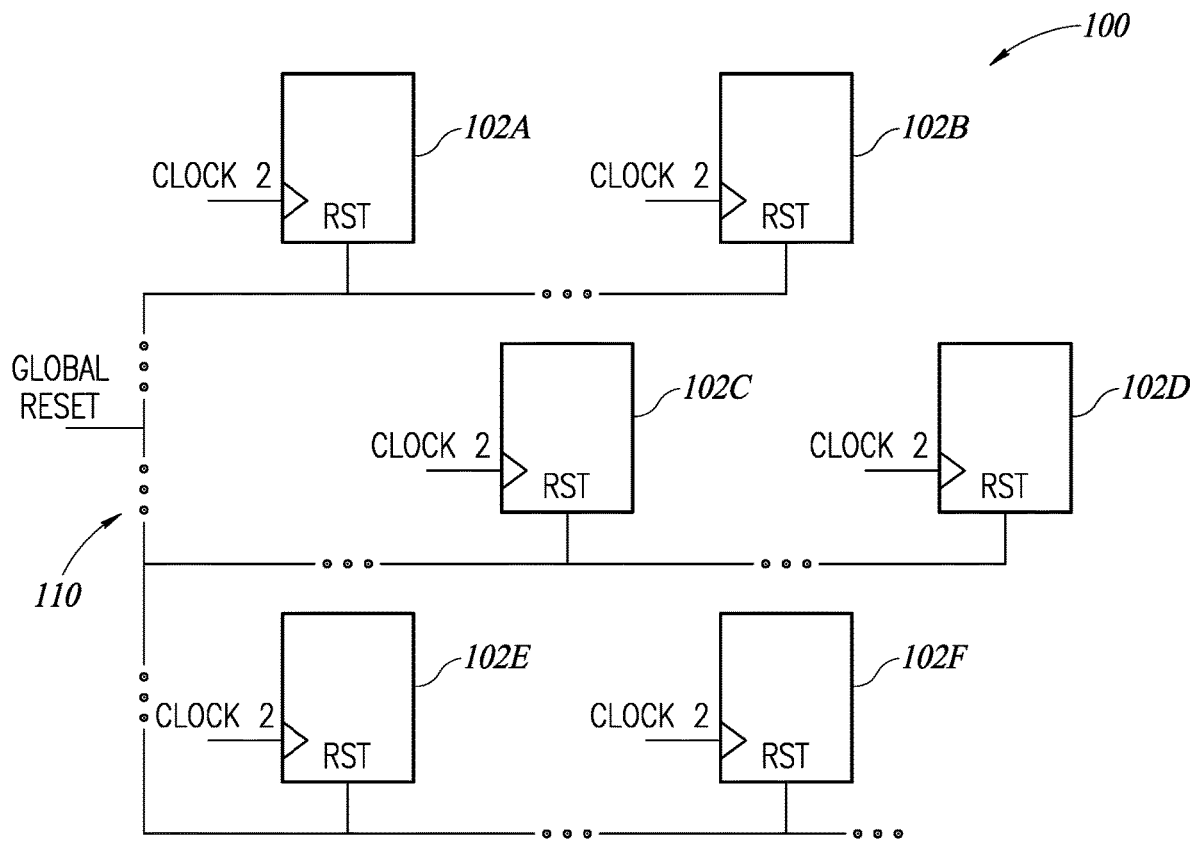
FIG. 1B is a schematic diagram of a group of flip-flops and a reset network of the integrated circuit of FIG. 1A, according to one embodiment.

FIG. 1B is a schematic diagram of a portion of the integrated circuit 100 of FIG. 1A, according to the body. In particular, FIG. 1B is a simplified schematic diagram of the flip-flops 102 and the reset network 110 of FIG. 1A. FIG. 1B illustrates flip-flops 102A-102F connected by single paths of the reset network 110. The single paths supply the global reset signal to the reset terminals of the flip-flops 102A-102F. Each of the flip-flops 102A-102F also receives the second clock signal on clock terminals of the flip-flops 102A-102F. In practice, the integrated circuit wanted to include a much larger number of flip-flops 102 than are illustrated in FIG. 1B.

As illustrated in FIG. 1B, the reset network 110 may include a delay element positioned to introduce a delay in the propagation time of the global reset signal to all of the flip-flops 102A-102F. The purpose of this delay is to ensure that all of the flip-flops 102A-102F receive the global reset signal after the synchronous clock delay circuit introduces the delay into the second clock signal. Without the delay element in the reset network 110, it is possible that some of the flip-flops 102A-102F may receive the global reset signal during standard operation of the second clock signal and thus may receive the global reset signal during a transition in the second clock signal. A single delay element introduces a delay that is short enough to ensure that the global reset signal reaches all of the flip-flops 102A-102F before the transition in the second clock signal. In other words, the delay element of the reset network and the delay in the transition of the second clock signal are selected so that the global reset signal arrives at all of the flip-flops 102A-102F after the synchronous clock delay circuit begins delaying the transition in the second clock signal and before the synchronous clock delay circuit ceases delaying the transition in the second clock signal.

Figure 1C:
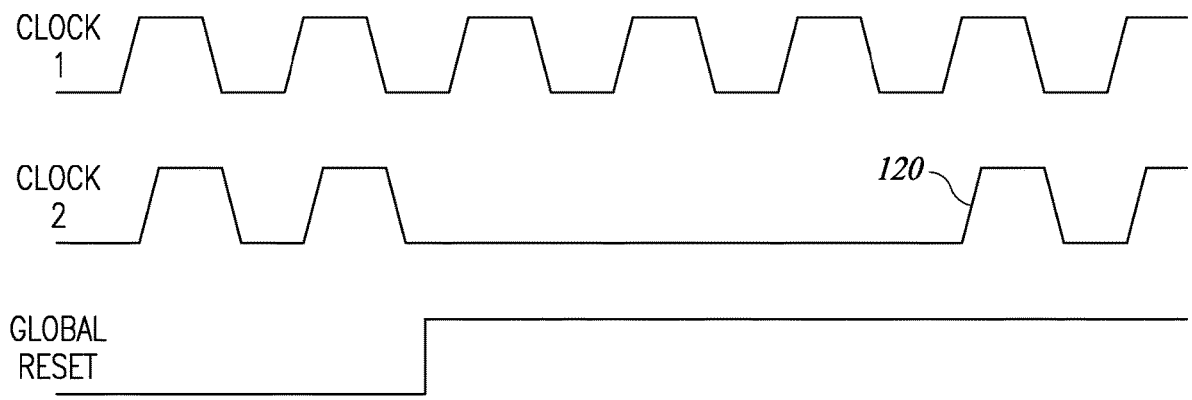
FIG. 1C illustrates graphs of various signals generated in the integrated circuit of FIG. 1A, according to one embodiment.

FIG. 1C illustrates graphs of the first clock signal, the second clock signal, and the global reset signal of FIG. 1A, according to one embodiment. The first clock signal is generated by the clock circuit 104. The second clock signal is generated by the synchronous clock delay circuit 112. The global reset signal is generated by the global reset generator 108.

In the example of FIG. 1C, the second clock signal has the same frequency as the first clock signal. The second clock signal is slightly offset time from the first clock signal due to slight signal propagation delays increased by circuit components of the synchronous clock delay circuit 112.

In the example of FIG. 1C, the global reset signal is initially a low logic value, or a value of "0". After two cycles of the first and second clock signals, the global reset generator 108 outputs the global reset signal. In this example, outputting the global reset signal corresponds to causing the value of the global reset signal to transition from a low logic value to a high logic value. Other schemes for the global reset signal can be utilized without departing from the scope of the present disclosure.

After the global reset signal has gone high, the synchronous clock delay circuit 112 initiates a delay in the next transition 120 of the second clock signal. The synchronous clock delay circuit delays the next rising edge of the second clock signal for several cycles of the first clock signal. The length of the delay is designed or selected to ensure that all of the flip-flops 102 receive the global reset signal before the next transition 120 in the second clock signal. In the example of FIG. 1C, the transition 120 in the second clock signal is delayed for three cycles of the first clock signal. The delay in the transition 120 can have other values without departing from the scope of the present disclosure.

Figure 2:
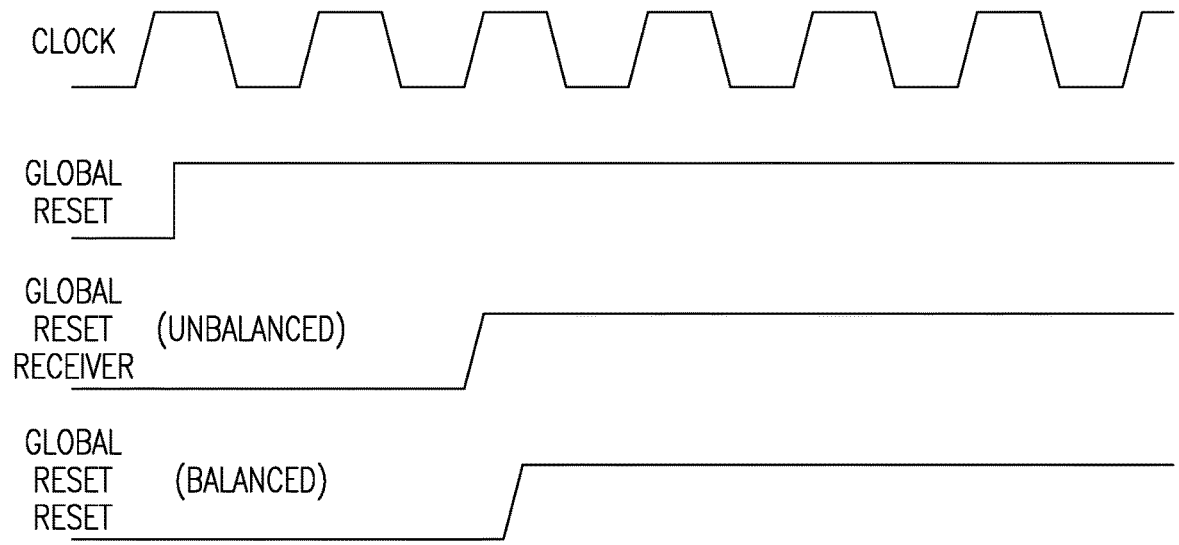
FIG. 2 illustrates graphs of various signals generated in an integrated circuit, according to one embodiment.

FIG. 2 illustrates graphs of various signals generated within an integrated circuit 100 in the absence of a synchronous clock delay circuit 112. In particular, FIG. 2 illustrates a clock signal, a global reset signal, timing of reception of the global reset signal by a flip-flop 102 from an unbalanced reset network, and timing of reception of the global reset signal by a flip-flop 102 from a balance reset network.

In the example of FIG. 2, the global reset signal goes high after the first transition in the clock signal. The flip-flop 102 in the unbalanced network receives the global reset signal during the third rising edge of the clock signal. This results in a faulty reset of the flip-flop 102 in the unbalanced network. Because the reset network 110 was not balanced in accordance with strict timing considerations, the flip-flop went on to receive the global reset signal during the rising edge of the clock signal and did not properly reset.

In the example FIG. 2 the flip-flop 102 in the balanced global network properly receives the global reset signal between edges of the transitions of the clock signal. This is because the reset network properly balanced. However, as described previously, properly balancing of the reset network 110 in the absence of the synchronous clock delay circuit 112 is achieved at a high cost of semiconductor area and design constraints. Accordingly, the integrated circuit 100 of FIG. 1 including the synchronous clock delay circuit 112 provides many benefits over integrated circuits 100 that balance the reset network 110 in the absence of the synchronous clock delay circuit 112.

Figure 3A:
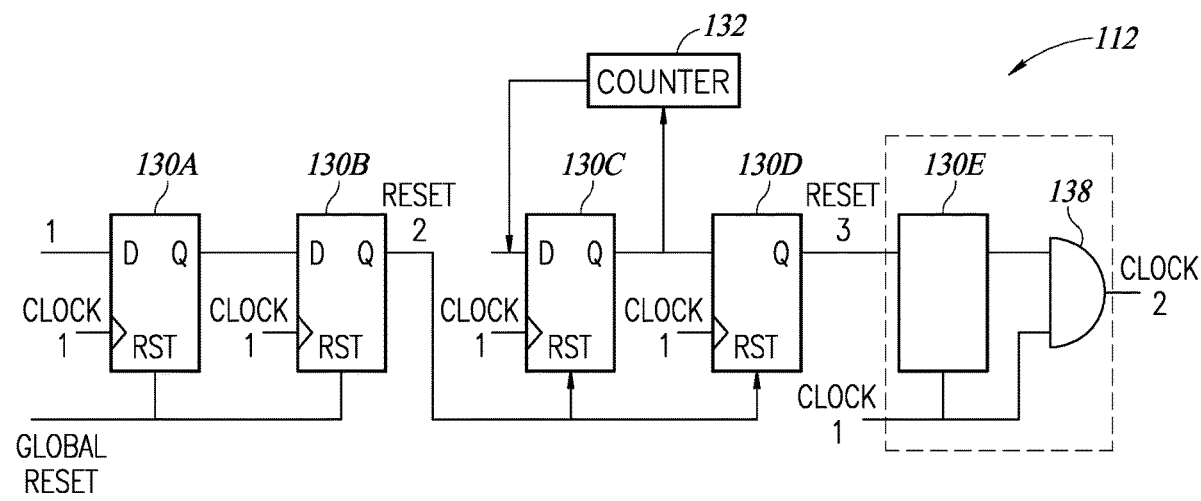
FIG. 3A is a schematic diagram of a synchronous clock delay circuit, according to one embodiment.

FIG. 3A is a schematic diagram of a synchronous clock delay circuit 112, according to one embodiment. The synchronous clock delay circuit 112 includes flip-flops 130A-130E, a counter 132, and a clock buffer 134. The components of the synchronous clock delay circuit 112 cooperate to selectively delay a transition in the second clock signal responsive to the global reset signal.

Each of the flip-flops 130A-130E receives the first clock signal from the clock circuit 104. The flip-flops 130A and 130B receive the global reset signal on their reset terminals. The input of the flip-flop 130A receives a high logic value. The input of the flip-flop 130B receives the output of the flip-flop 130A. The flip-flop 130B outputs a second reset signal. The reset terminals of the flip-flops 103C and 130D receive the second reset signal from the output of the flip-flop 130B. The input of the flip-flop 130C is coupled to an output of the counter 132. The input of the counter 132 and the input of the flip-flop 130D are coupled to the output of the flip-flop 130C. The output of the flip-flop 130D is a third reset signal. One input of the clock buffer 134 is coupled to the output of the flip-flop 130D. The other input clock buffer 134 receives the first clock signal. The output of the clock buffer 134 is the second clock signal. The clock buffer includes the flip-flop 130E and an AND gate 138. The input of the flip-flop 130E is the third reset signal. The output of the flip-flop 130E is provided to one of the inputs of the AND gate 138. The first clock signal is provided to the other input AND gate 138. The output of the AND gate 138 is the second clock signal.

In one embodiment, the synchronous clock delay circuit 112 introduces a delay in the transition of the second clock signal for selected number of cycles of the first clock signal. In particular, the counter 132 can include or can be coupled to a logic circuit that changes the output of the counter 132 after the counter 132 counts a predetermined number of cycles of the first clock signal. When the counter 132 has counted the predetermined number of cycles, the counter 132 outputs a signal to the input of the flip-flop 130C that seizes the delay of the transition of the second clock cycle.

Figure 3B:
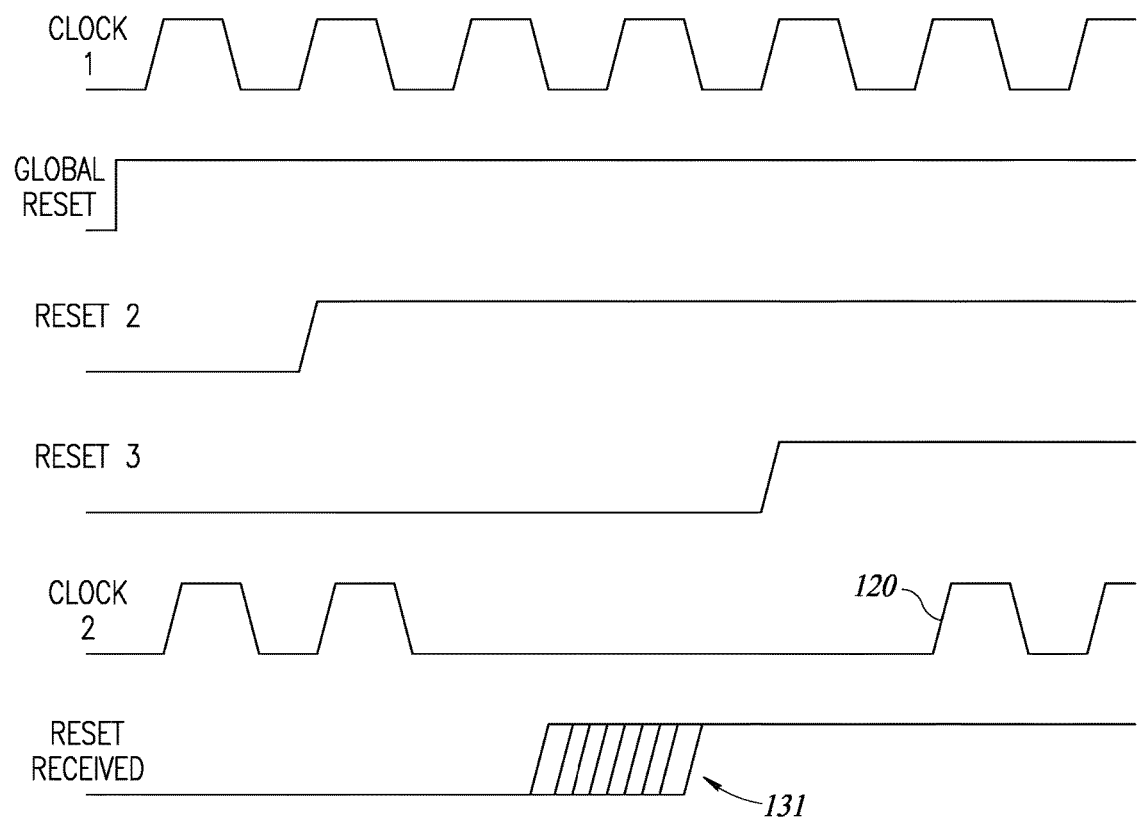
FIG. 3B illustrates graphs of various signals generated in association with the synchronous clock delay circuit of FIG. 3A, according to one embodiment.

FIG. 3B illustrates graphs of various signals associated with the synchronous clock delay circuit 112, according to one embodiment. With reference to both FIG. 3A and FIG. 3B, during standard operation of the integrated circuit 100, the global reset signal is at a low logic value. The second clock signal operates at the frequency of the first clock cycle without delays in transitions of the second clock cycle. After two rising edges of the first clock signal the global reset signal goes to a high logic value, the second reset signal, i.e., the output of the flip-flop 130B, goes to a high logic value. One clock cycle later, the delay in the transition 120 of the second clock cycle begins.

In the example of FIGS. 3A and 3B, the threshold value for the counter 132 is three. In other words, after the counter has counted three cycles of the first clock signal, the output of the counter 132 goes high. The result is that the third reset signal goes high. One clock cycle later, the transition in the second clock signal occurs, i.e., the second part signal returns to normal operation.

FIG. 3B illustrates the timing of reception 131 of the global reset signal by various of the flip-flops 102. Reception of the global reset signal by one of the flip-flops 102 is indicated by a transition line from the low logic value to the high logic value in the reset received graph. The flip-flops will receive the global reset signal after the beginning of the delay in the transition 120 of the second clock cycle and before the occurrence of the transition 120 of the second clock cycle. Accordingly, none of the flip-flops wanted to receive the global reset signal during a transition in the second clock cycle.

Figure 4A:
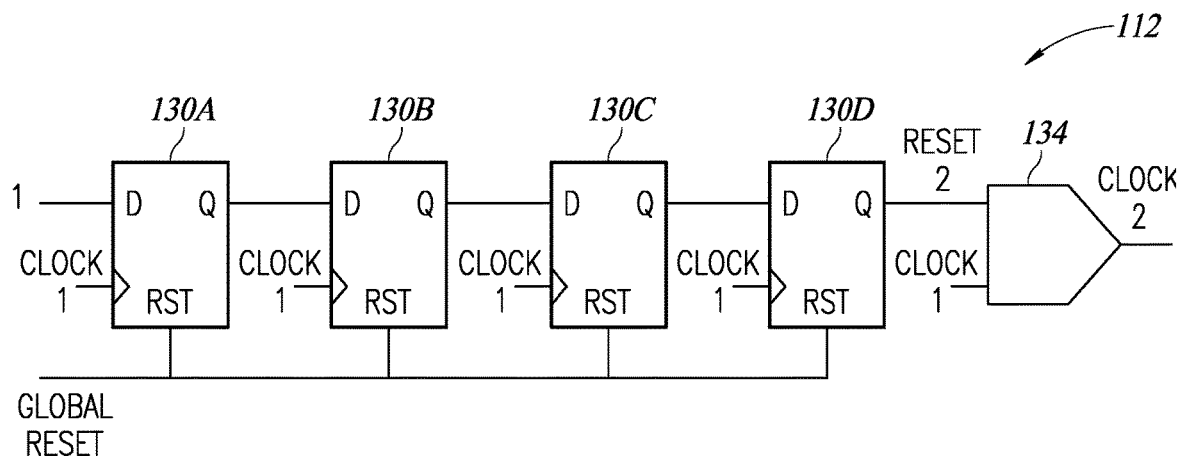
FIG. 4A is a schematic diagram of a synchronous clock delay circuit, according to one embodiment.

FIG. 4A is a schematic diagram of a synchronous clock delay circuit 112, according to one embodiment. The synchronous clock delay circuit 112 includes flip-flops 103A-103D and a clock buffer 134. The components of the synchronous clock delay circuit 112 cooperate to selectively delay a transition in the second clock signal responsive to the global reset signal.

Each of the flip-flops 130A-130D receives the first clock signal from the clock circuit 104. Each of the flip-flops 130A-130D receives the global reset signal on a reset terminal. The flip-flops 130A-130D are connected in series with each other. The output of the flip flop 130D is a second reset signal. The output of the clock buffer 134 is the second clock signal.

The input of the flip-flop 130A receives a high logic value. The input of the flip-flop 130B receives the output of the flip-flop 130A. The input of the flip-flop 130C receives the output of the flip-flop 130B. The input of the flip-flop 130D receives the output of the flip-flop 130C. The output of the flip-flop 130D is a third reset signal. One input of the clock buffer 134 is coupled to the output of the flip-flop 130D. The other input clock buffer 134 receives the first clock signal. The clock buffer 134 can be the same as the clock buffer 134 of FIG. 3A.

In one embodiment, the synchronous clock delay circuit 112 introduces a delay in the transition of the second clock signal for selected number of cycles of the first clock signal based on the number of flip-flops connected in series.

Figure 4B:
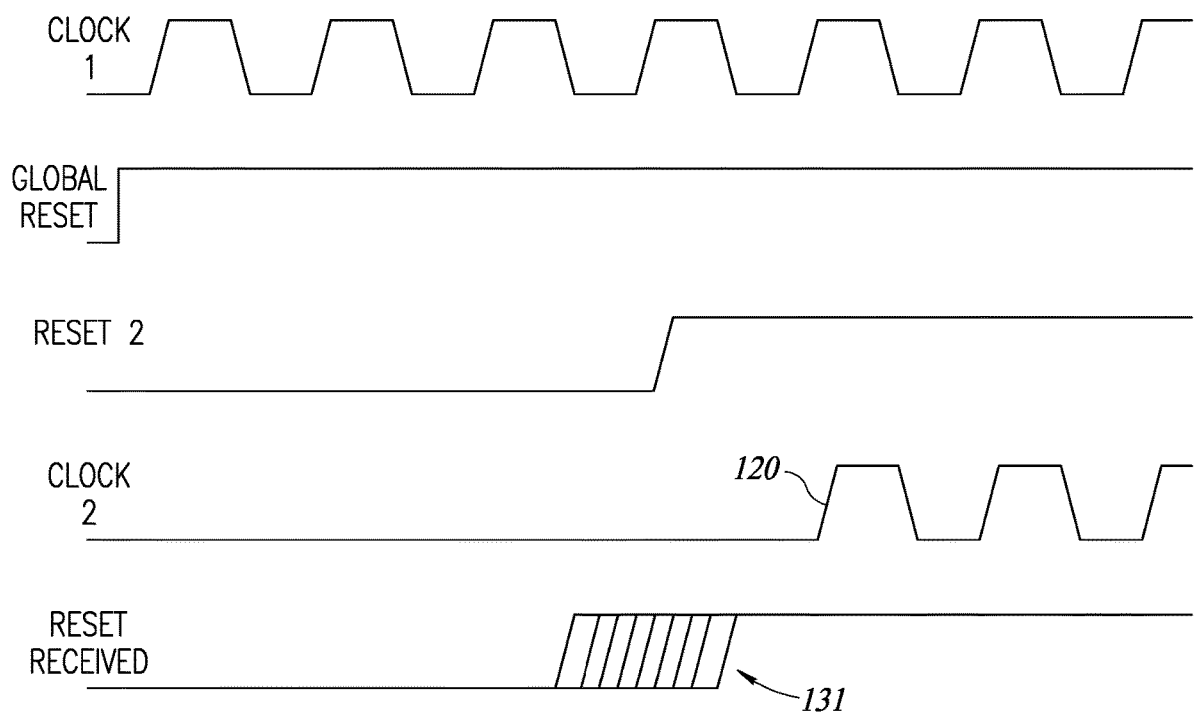
FIG. 4B illustrates graphs of various signals generated in association with the synchronous clock delay circuit of FIG. 3A, according to one embodiment.

FIG. 4B illustrates graphs of various signals associated with the synchronous clock delay circuit 112, according to one embodiment. With reference to both FIG. 3A and FIG. 3B, during standard operation of the integrated circuit 100, the global reset signal is at a low logic value. The second clock signal operates at the frequency of the first clock cycle without delays in transitions of the second clock cycle. After the global reset signal is received, the transition 120 in the second clock cycle is delayed.

In the example of FIGS. 4A and 4B, the threshold value for the counter 132 is three. After the high logic value propagates from the input of the flip-flop 130A through the chain of flip-flops 130 to the second reset signal, the transition 120 in the clock signal occurs.

FIG. 4B illustrates the timing of reception 131 of the global reset signal by various of the flip-flops 102. Reception of the global reset signal by one of the flip-flops 102 is indicated by a transition line from the low logic value to the high logic value in the reset received graph. The flip-flops 102 will receive the global reset signal after the beginning of the delay in the transition 120 of the second clock cycle and before the occurrence of the transition 120 of the second clock cycle. Accordingly, none of the flip-flops 102 receive the global reset signal during a transition in the second clock cycle.

Figure 5:
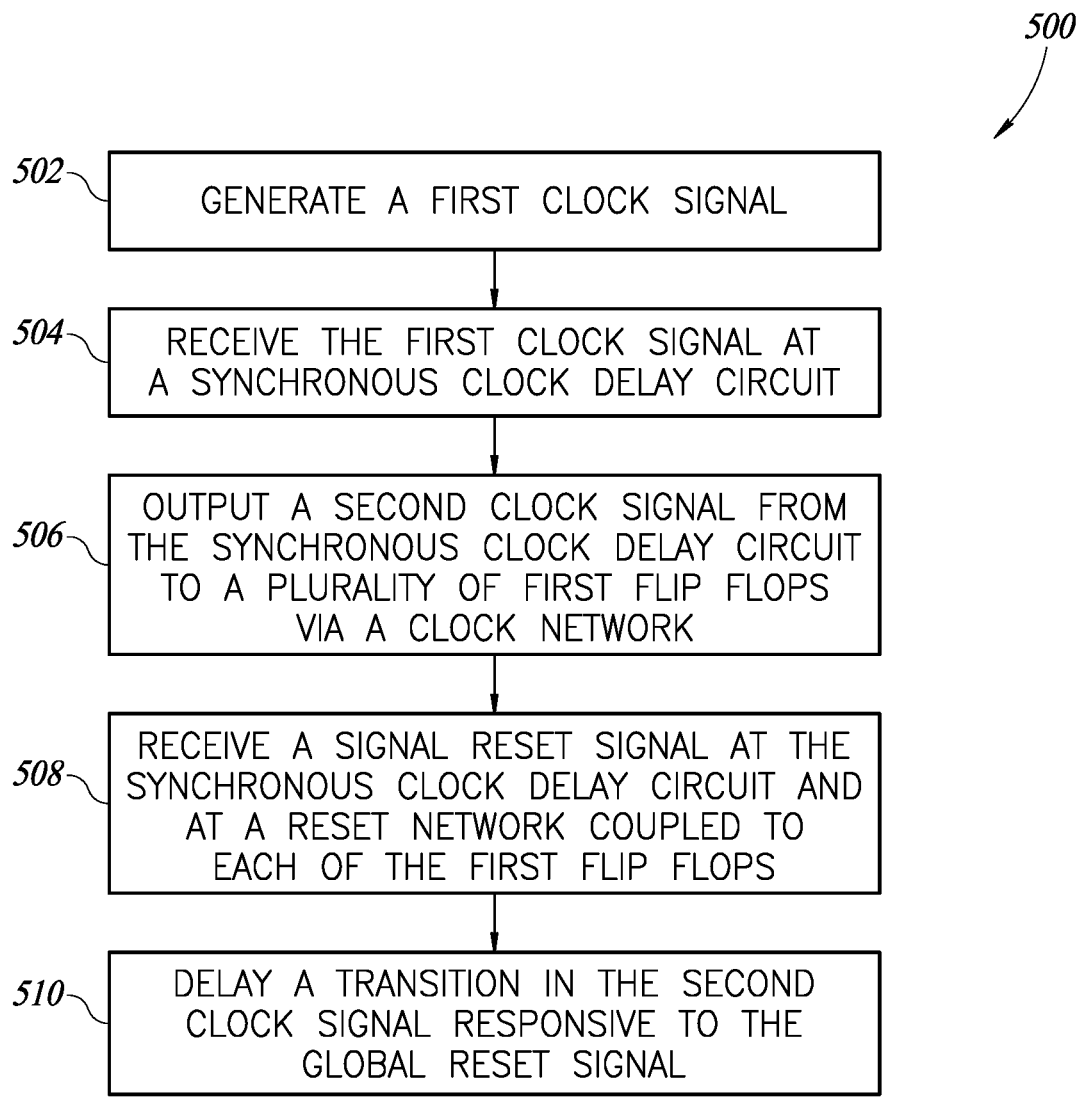
FIG. 5 is a flow diagram of a method for managing global resets of an integrated circuit, according to an embodiment.

FIG. 5 is a flowchart of a method for managing a global reset of an integrated circuit, according to one embodiment. At 502, 500 includes generating a first clock signal. At 506, the method 500 includes outputting a second clock signal from the synchronous clock delay circuit to a plurality of first flip-flops via a clock network. At 508, the method 500 includes receiving a global reset signal at a synchronous clock delay circuit and at a reset network coupled to each of the first flip-flops. At 510, the method 500 includes delaying a transition in the second clock signal responsive to the global reset signal.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An integrated circuit, comprising:
a plurality of first flip-flops each including a data input terminal, a clock input terminal, and a reset terminal;
a reset network configured to supply a global reset signal to the reset terminal of each of the first flip-flops;
a clock circuit configured to generate a first clock signal;
a synchronous clock delay circuit configured to receive the first clock signal and to output a second clock signal to the clock input terminals of the plurality of first flip-flops, wherein the synchronous clock delay circuit is configured to receive the global reset signal while outputting the second clock signal to the clock input terminals of the first flip-flops and to delay a transition in the second clock signal by a delay duration responsive to the global reset signal; and
a clock network configured to receive the second clock signal from the synchronous clock delay circuit and to provide the second clock signal to the clock input terminals of the first flip-flops, wherein the delay duration is selected to ensure that the global reset signal arrives at the first flip-flops before the transition of the second clock signal arrives at the first flip-flops.

2. The integrated circuit of claim 1, wherein the reset network and the synchronous clock delay circuit are configured to ensure that all of the first flip-flops receive the global reset signal after the synchronous clock delay circuit begins delaying the transition in the second clock signal and before the synchronous clock delay circuit stops delaying the transition in the second clock signal.

3. The integrated circuit of claim 2, wherein the reset network includes one or more delay elements selected to ensure that each of the first flops receives the global reset signal after the synchronous clock delay circuit begins delaying the transition in the second clock signal.

4. The integrated circuit of claim 3, wherein the synchronous clock delay circuit is configured to delay the transition of the second clock signal, responsive to the global reset signal, for a selected number of cycles of the first clock signal.

5. The integrated circuit of claim 1, wherein the synchronous clock delay circuit includes a counter configured to count a number of clock cycles of the first clock signal after reception of the global reset signal, wherein the synchronous clock delay circuit is configured to delay the transition until the counter reaches a selected number.

6. The integrated circuit of claim 1, wherein the synchronous clock delay circuit includes a plurality of second flip-flops connected in series and each configured to receive the global reset signal and the first clock signal.

7. The integrated circuit of claim 6, wherein the synchronous clock delay circuit includes a clock buffer configured to receive the first clock signal, to receive a reset interrupt signal from one of the second flip-flops, and to output the second clock signal.

8. The integrated circuit of claim 1, wherein the transition is a rising edge or a falling edge of the second clock signal.

9. A method, comprising:
generating a first clock signal;
receiving the first clock signal at a synchronous clock delay circuit;
outputting a second clock signal from the synchronous clock delay circuit to clock input terminals of a plurality of first flip-flops via a clock network, each flip-flop including a data input terminal and a reset terminal;
receiving, while outputting the second clock signal to the clock input terminals of the first flip-flops, a global reset signal at the synchronous clock delay circuit and at a reset network coupled to each of the first flip-flops;
supplying the global reset signal to the reset terminal of each of the first flip-flops; and
delaying, responsive to receiving the global reset signal, a transition in the second clock signal longer than a time required for each of the first flip-flops to receive the global reset signal.

10. The method of claim 9, further comprising receiving the global reset signal at each of the first flip-flops after the synchronous clock delay circuit begins delaying the transition in the second clock signal and before the synchronous clock delay circuit stops delaying the transition in the second clock signal.

11. The method of claim 10, further comprising delaying the transition of the second clock signal for a selected number of cycles of the first clock signal.

12. The method of claim 11, wherein the first clock signal and the second clock signal have a same frequency when the synchronous clock delay circuit does not delay the transition in the second clock signal.

13. The method of claim 9, further comprising:
counting a number of clock cycles of the first clock signal after reception of the global reset signal; and
delaying the transition until a counter reaches a selected number.

14. The method of claim 9, further comprising:
receiving the first clock signal and the global reset signal at each of a plurality of serially connected second flip-flops of the synchronous clock delay circuit; and
providing a reset interrupt signal from one of the second flip-flops;
receiving the first clock signal and the reset interrupt signal at a clock buffer of the synchronous clock delay circuit; and
outputting the second clock signal from the clock buffer.

15. An integrated circuit, comprising:
a global reset generator configured to generate a global reset signal;
a plurality of flip-flops each including a data input terminal, a clock input terminal, and a reset terminal;
a reset network configured to provide the global reset signal to the reset terminal of each of the flip-flops;
a clock circuit configured to generate a first clock signal; and
a clock delay generator configured to receive the first clock signal, to generate a second clock signal based on the first clock signal, to receive the global reset signal while outputting the second clock signal to the clock input terminal of each of the flip-flops, and to delay a rising edge or a falling edge of the second clock signal responsive to the global reset signal for a duration selected to ensure that the global reset signal arrives at the flip-flops before a transition of the second clock signal arrives at the clock input terminals of the flip-flops.

16. The integrated circuit of claim 15, further comprising a clock network configured to provide the second clock signal to the clock input terminal of each of the flip-flops.

17. The integrated circuit of claim 1, wherein the synchronous clock delay circuit is configured to delay a rising edge or falling edge beyond reception of the global reset signal by all of the flip-flops.

18. The integrated circuit of claim 1, wherein the flip-flops are configured to receive data at their data input terminals.

19. The method of claim 9, comprising supplying data to the data input terminals of the flip-flops.

* * * * *